(12) United States Patent
Isogai

(10) Patent No.: US 7,592,659 B2
(45) Date of Patent: Sep. 22, 2009

(54) FIELD EFFECT TRANSISTOR AND AN OPERATION METHOD OF THE FIELD EFFECT TRANSISTOR

(75) Inventor: Kazunori Isogai, Kyoto-fu (JP)

(73) Assignee: Panasonic Corporation, Osaka (JP)

( * ) Notice: Subject to any disclaimer, the term of this patent is extended or adjusted under 35 U.S.C. 154(b) by 222 days.

(21) Appl. No.: 11/366,822

(22) Filed: Mar. 3, 2006

(65) Prior Publication Data

US 2006/0223251 A1  Oct. 5, 2006

(30) Foreign Application Priority Data

Mar. 3, 2005  (JP) ............................. 2005-058797

(51) Int. Cl.
*H01L 27/108* (2006.01)

(52) U.S. Cl. .................. 257/300; 257/295; 257/296; 257/E29.344; 257/E29.345

(58) Field of Classification Search ............... 257/315, 257/296, 295, 405, 312, E29.344, E29.345
See application file for complete search history.

(56) References Cited

U.S. PATENT DOCUMENTS

| | | | | |
|---|---|---|---|---|
| 6,864,529 B2 * | 3/2005 | Mei et al. | ..................... | 257/315 |
| 6,956,280 B2 * | 10/2005 | Tajiri et al. | .................. | 257/537 |
| 7,045,840 B2 * | 5/2006 | Tamai et al. | ................. | 257/295 |
| 7,154,140 B2 * | 12/2006 | Forbes | ......................... | 257/315 |
| 2004/0041180 A1 * | 3/2004 | Dimmler et al. | ............ | 257/295 |
| 2004/0065912 A1 | 4/2004 | Liu et al. | | |

\* cited by examiner

*Primary Examiner*—Matthew E Warren
(74) *Attorney, Agent, or Firm*—McDermott Will & Emery LLP

(57) ABSTRACT

A field effect transistor includes a silicon substrate, a source electrode and a drain electrode which are formed in upper portions of the silicon substrate, and an insulator film, a PCMO film, and a gate electrode which are formed on part of the silicon substrate sandwiched between the source electrode and the drain electrode. Data writing is performed by changing a voltage level of a write voltage applied to the PCMO film, and data reading is performed by applying a read voltage to the PCMO film and detecting a drain current.

12 Claims, 4 Drawing Sheets

1

FIELD EFFECT TRANSISTOR AND AN OPERATION METHOD OF THE FIELD EFFECT TRANSISTOR

This application is based on an application No. 2005-58797 filed in Japan, the contents of which are hereby incorporated by reference.

BACKGROUND OF THE INVENTION

1. Field of the Invention

The present invention relates to a field effect transistor having a variable gate capacitance and an operation method of the field effect transistor, and in particular relates to techniques for reduction in power consumption and reading error of the field effect transistor.

2. Related Art

A CMR (colossal magnetoresistive) material having a perovskite structure changes its properties according to external effects. For example, when a voltage pulse of an appropriate field intensity is applied at least once to a construction in which a thin film or bulk film of $Pr_{0.7}Ca_{0.3}MnO_3$ (hereafter simply referred to as "PCMO") is sandwiched between two electrodes, the PCMO film changes its properties. The properties that can change according to external effects include an electrical resistance (resistivity) and a capacitance (relative permittivity). These properties show different changes depending on a polarity of the voltage pulse applied. Once changed, the properties are stably maintained even after the application of the voltage pulse ends.

Taking advantage of this feature, a device that uses a PCMO film as a variable capacitance film is conventionally developed (see U.S. Patent Application Publication No. US 2004/0065912 A1). FIG. 1 is a sectional view showing a construction of such a device that uses a PCMO film as a variable capacitance film. In the drawing, a device 3 is formed by disposing an electrode 302, a PCMO film 303, and an electrode 304 on a substrate 301 in this order. The electrodes 302 and 304 are connected respectively with wires 302a and 304a. The electrode 304 has a circular main surface with a radius of 0.4 mm, and the PCMO film 303 has a film thickness of 600 nm.

When a voltage pulse of 18 V or −18 V is applied to the PCMO film 303 via the wires 302a and 304a, the PCMO film 303 changes in relative permittivity and electrical resistance. FIGS. 2A and 2B are graphs showing how these properties of the PCMO film 303 change upon repeated application of the voltage pulse. In detail, FIG. 2A shows changes in relative permittivity, whereas FIG. 2B shows changes in electrical resistance. In FIGS. 2A and 2B, the vertical axes respectively represent the relative permittivity and the electrical resistance, and the horizontal axes both represent time.

As shown in FIG. 2A, the relative permittivity of the PCMO film 303 changes to 405 upon application of a voltage pulse of −18 V, and changes to 135 upon application of a voltage pulse of 18 V. Also, as shown in FIG. 2B, the electrical resistance of the PCMO film 303 changes to 3500 Ω upon application of a voltage pulse of −18 V, and changes to 200 Ω upon application of a voltage pulse of 18 V. Once changed, the relative permittivity of the PCMO film 303 is maintained stably for at least three years. Hence a nonvolatile memory can be realized by relating the high and low levels in relative permittivity of the PCMO film 303 to the two binary states 0 and 1.

To change a relative permittivity of a PCMO film, in general it is necessary to apply a voltage pulse of at least several V to the PCMO film, though this varies depending on film thickness. To detect the relative permittivity of the PCMO film, on the other hand, it is sufficient to apply a voltage pulse of about 0.1 V to the PCMO film so as to detect a current. Thus, in the case where the PCMO film is used as a nonvolatile memory, writing data requires largest power.

In the above device 3, an area of the main surface of the electrode 304 is about 0.5 mm$^2$, and the electrical resistance of the PCMO film 303 in a low resistance state is about 200 Ω. Accordingly, when a voltage pulse of 18 V is applied, a current of 90 mA flows, and 1.6 W of power is consumed. If the area of the main surface of the electrode 304 is reduced to 0.64 μm$^2$ (0.8 μm×0.8 μm), the electrical resistance of the PCMO film 303 in a low resistance state is 25 KΩ. This being the case, when a voltage pulse of 5 V is applied, a current of 200 μA flows, and the power consumption can be reduced to 1 mW (see Technical Digest of IEEE International Electron Device Meeting (2002), p. 193).

However, when compared with a volatile memory such as an SRAM (static random access memory) whose power consumption is about 1 μW, the device 3 using the PCMO film still has an extremely high power consumption, and is unsuitable for practical use.

SUMMARY OF THE INVENTION

The present invention was conceived in view of the above problems, and aims to provide a nonvolatile memory with a lower power consumption and fewer reading errors.

The stated aim can be achieved by a field effect transistor including: a semiconductor substrate; a gate electrode; and a gate insulator provided between the semiconductor substrate and the gate electrode, and having a capacitance that changes according to an applied voltage.

According to this construction, the threshold voltage can be changed by changing the capacitance of the gate insulator. As a result, the capacitance of the gate insulator can be detected based on whether or not a drain current flows upon application of an appropriate voltage to the gate insulator. This allows the field effect transistor to be used as a memory. In such a memory, a capacitance change of the gate insulator can be detected based on whether or not a drain current flows, so that data reading can be performed with high sensitivity.

Here, the gate insulator may include a variable capacitance film which is made of any of a colossal magnetoresistive material and a transition metal oxide.

Here, the colossal magnetoresistive material may be $Pr_XCa_{1-X}MnO_3$ where 0<X<1.

According to these constructions, the capacitance of the variable capacitance film changes when a voltage is applied to the gate electrode. As a result, the capacitance of the gate insulator can take two or more values. Once changed, the capacitance of the variable capacitance film which is made of a colossal magnetoresistive material or a high-temperature superconducting material is maintained stably, so that the field effect transistor is suitable as a nonvolatile memory.

Here, the gate insulator may further include an insulator film which is positioned between the semiconductor substrate and the variable capacitance film.

According to this construction, the capacitance of the variable capacitance film can be changed without a current flow to the variable capacitance film. This contributes to a lower power consumption.

Here, the gate insulator may further include a conductor film which is positioned between the insulator film and the variable capacitance film.

According to this construction, an effective area of the insulator film and an effective area of the variable capacitance film can be designed independently of each other.

Here, a contact area between the gate electrode and the variable capacitance film may be smaller than a contact area between the conductor film and the insulator film.

According to this construction, a voltage necessary for changing the capacitance of the variable capacitance film can be reduced. Also, an amount of change of the threshold voltage according to the capacitance of the variable capacitance film can be increased, with it being possible to increase a read voltage margin and thereby improve data reading sensitivity.

Here, the capacitance of the gate insulator may change according to at least one of a voltage level, a pulse width, and a number of applications of a voltage pulse applied to the gate insulator.

The stated aim can also be achieved by an operation method of a field effect transistor in which a gate insulator and a gate electrode are provided on a semiconductor substrate in the stated order, the gate insulator having a capacitance that changes according to an applied voltage, including steps of: applying an intermediate voltage between two threshold voltages corresponding to two capacitances, to the gate electrode as a read voltage; and detecting whether a drain current flows as a result of the application of the read voltage.

According to this method, the drain current is detected with high sensitivity, with it being possible to reduce reading errors.

Here, the read voltage may be below a voltage necessary for changing the capacitance of the gate insulator.

According to this method, the capacitance of the gate insulator will not be changed by data reading, so that data can be read without destroying stored data. This enhances memory reliability.

The stated aim can also be achieved by an operation method of a field effect transistor in which a gate insulator and a gate electrode are provided on a semiconductor substrate in the stated order, including a step of changing a capacitance of the gate insulator by changing at least one of a voltage level, a pulse-width, and a number of applications of a voltage pulse applied to the gate insulator.

According to this method, the capacitance of the variable capacitance film can be changed easily.

BRIEF DESCRIPTION OF THE DRAWINGS

These and other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT(S)

The following describes embodiments of a field effect transistor and its operation method according to the present invention, with reference to drawings.

First Embodiment

A field effect transistor to which a first embodiment of the present invention relates is described below.

<Construction of the Field Effect Transistor>

Figure 1:
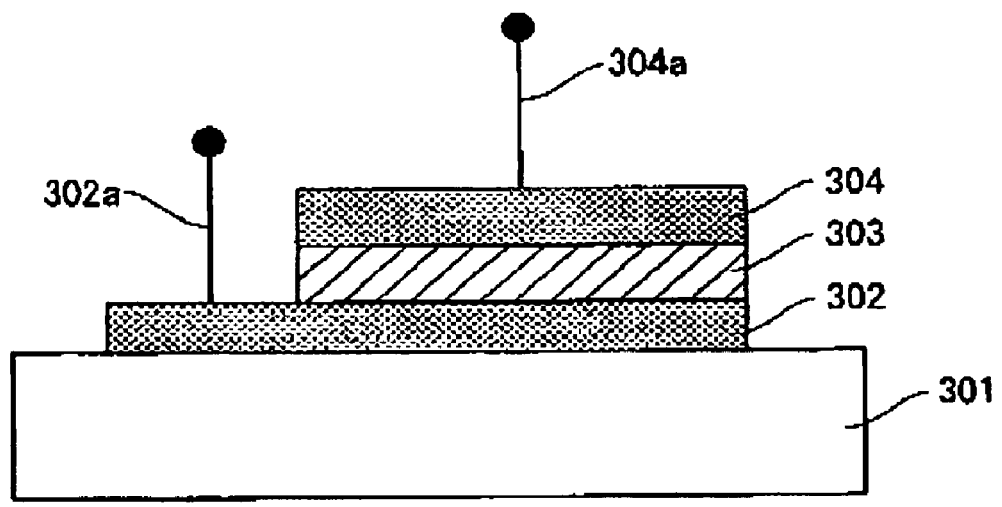
FIG. 1 is a sectional view showing a construction of a conventional device that uses a PCMO film as a variable capacitance film.
Figure 2A:
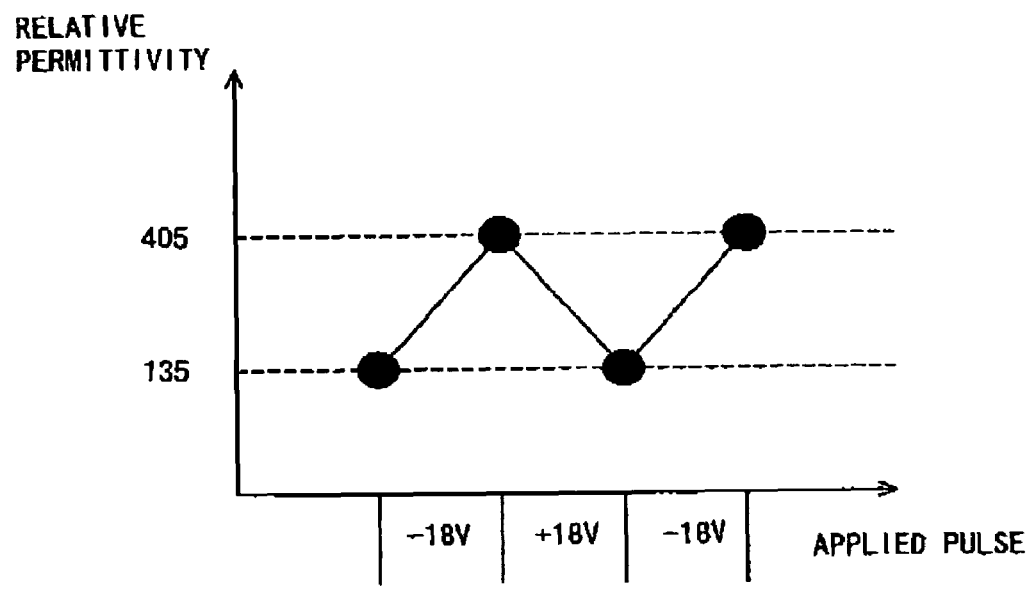
FIGS. 2A and 2B are graphs showing changes in property of the PCMO film shown in FIG. 1 when a voltage pulse is repeatedly applied.
Figure 2B:
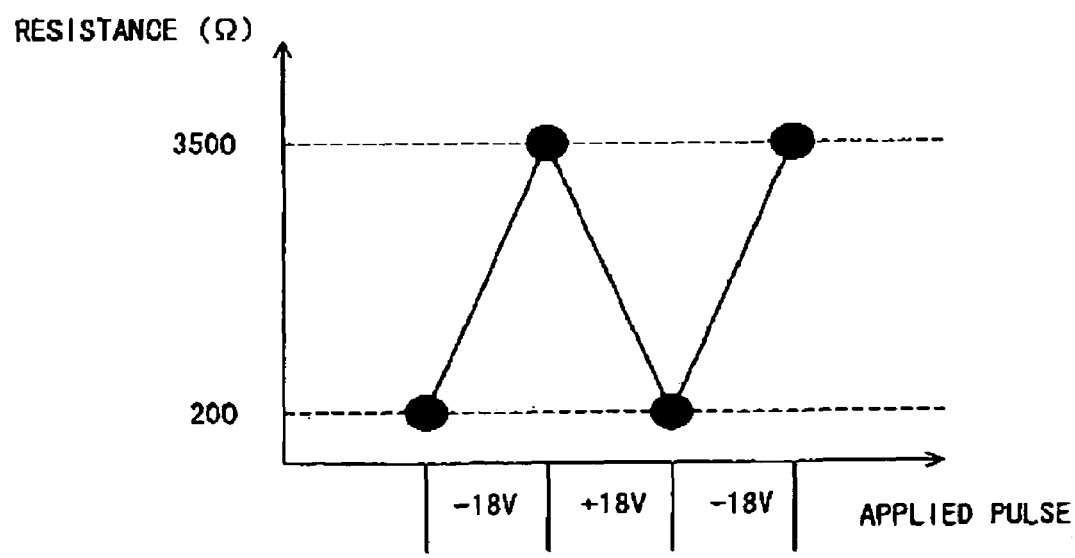
Figure 3:
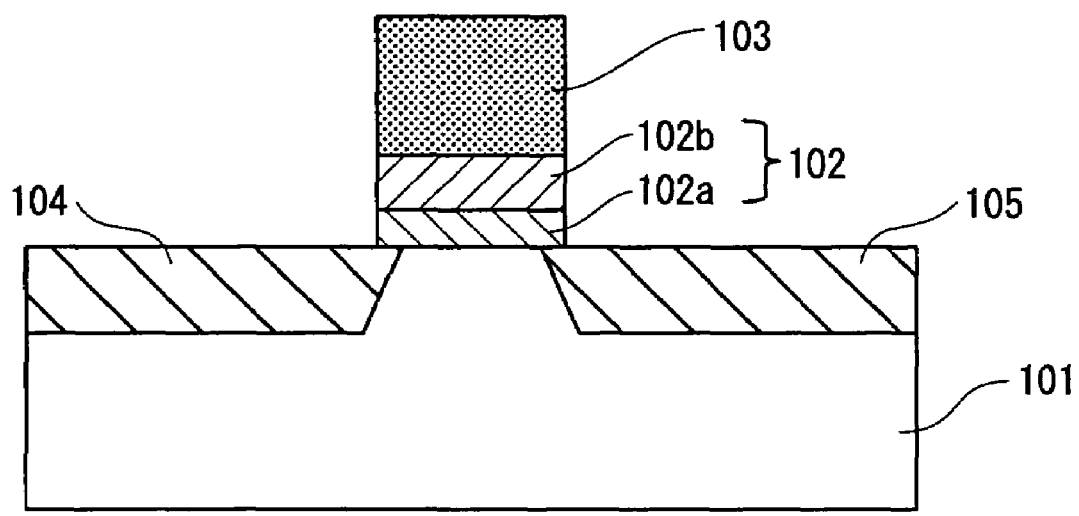
FIG. 3 is a sectional view showing a main part of a field effect transistor to which a first embodiment of the present invention relates.

FIG. 3 is a sectional view showing a main part of the field effect transistor of the first embodiment. In the drawing, a field effect transistor 1 includes a silicon substrate 101, a gate insulator 102, a gate electrode 103, a source electrode 104, and a drain electrode 105. The gate insulator 102 is composed of an insulator film 102a and a PCMO film 102b.

The silicon substrate 101 is a p-type silicon substrate, and has acceptor concentration $N_A$ of $1 \times 10^{22}$ m$^{-3}$. The source electrode 104 and the drain electrode 105 are n-type silicon layers formed in upper portions of the silicon substrate 101. The gate insulator 102 and the gate electrode 103 are disposed in this order on part of the silicon substrate 101 between the source electrode 104 and the drain electrode 105. The gate electrode 103 is made of platinum (Pt), and has a gate length of 0.18 μm.

In the gate insulator 102, the insulator film 102a is made of amorphous hafnium oxide (HfO$_2$), and has film thickness $d_I$ of 7.5 nm and relative permittivity $\in_I$ of 25. Meanwhile, the PCMO film 102b has film thickness $d_P$ of 100 nm, and relative permittivity $\in_P$ which, in the case where a frequency of a voltage pulse is no more than several tens of kHz, takes one of the two values 135 and 405. Area $S_I$ of a main surface of the insulator film 102a is equal to area $S_P$ of a main surface of the PCMO film 102b.

<Operation Method>

An operation method of the field effect transistor 1 is explained below.

(1) Data Writing (a) Write Voltage

A write voltage necessary for changing relative permittivity $\in_P$ of the PCMO film 102b in the field effect transistor 1 is explained first.

According to U.S. Patent Application Publication No. US 2004/0065912 A1, a voltage pulse necessary for changing a relative permittivity of a PCMO film having a film thickness of 600 nm is 18 V, which is $3 \times 10^7$ V/m in field intensity. If a field intensity necessary for changing a relative permittivity is fixed, then relative permittivity $\in_P$ of the PCMO film 102b having film thickness $d_P$ of 100 nm changes with a voltage pulse of 3 V.

Here, suppose the gate insulator 102 is a series capacitor circuit composed of the insulator film 102a and the PCMO film 102b. This being the case, write voltage $V_W$ applied to the gate electrode 103 is divided by the insulator film 102a and the PCMO film 102b. Resulting voltage $V_P$ of the PCMO film 102b is expressed by equation (1):

$$V_P = \frac{C_I}{C_I + C_P} \times V_W \quad (1)$$

where $C_I$ and $C_P$ respectively denote capacitances of the insulator film 102a and the PCMO film 102b. $C_I$ and $C_P$ are respectively given by equations (2) and (3):

$$C_I = \varepsilon_I \varepsilon_0 \frac{S_I}{d_I} \quad (2)$$

$$C_P = \varepsilon_P \varepsilon_0 \frac{S_P}{d_P} \quad (3)$$

where $\varepsilon_0$ denotes a vacuum permittivity.

Capacitance $C_P$ of the PCMO film 102b takes one of two large and small values according to relative permittivity $\varepsilon_P$. When capacitance $C_P$ is large, voltage $V_P$ of the PCMO film 102b is smallest. Accordingly, by setting voltage $V_P$ of the PCMO film 102b when capacitance $C_P$ is large to 3 V, relative permittivity $\varepsilon_P$ can be changed regardless of the magnitude of capacitance $C_P$. To set voltage $V_P$ of the PCMO film 102b when capacitance $C_P$ is large to 3 V, write voltage $V_W$ is set to 7 V.

In this case, however, a voltage of 4 V is applied to the insulator film 102a, which may cause a leakage current increase and a dielectric breakdown. Therefore, if it is possible to change relative permittivity $\varepsilon_P$ of the PCMO film 102b with a write voltage $V_W$ less than 7 V, then such a write voltage $V_W$ is more desirable.

Here, a pulse width of the voltage pulse may be 100 ns, and a number of applications of the voltage pulse may be 2.

(b) Threshold Voltage

Threshold voltage $V_{th}$ of the field effect transistor 1 is explained next. Threshold voltage $V_{th}$ is expressed by equation (4):

$$V_{th} = 2\Phi_F + q\frac{N_A}{C_{OX}}l_{Dm} + \Phi_D - q\frac{N_{SS}}{C_{OX}} \quad (4)$$

where denotes an elementary charge, $l_{DM}$ denotes a maximum depletion layer thickness, $\Phi_F$ denotes a Fermi level of the silicon substrate 101, $C_{OX}$ denotes a capacitance of the gate insulator 102, $\Phi_D$ denotes a work function difference between the gate electrode 103 and the silicon substrate 101, and $N_{SS}$ denotes an interface state density between the gate insulator 102 and the silicon substrate 101. Meanwhile, $N_A$ is the acceptor concentration of the silicon substrate 101, as mentioned earlier. Maximum depletion layer thickness $l_{DM}$ and Fermi level $\Phi_F$ of the silicon substrate 101 are respectively given by equations (5) and (6):

$$l_{Dm} = \sqrt{\frac{4\varepsilon_{Si}\varepsilon_0 \Phi_F}{qN_A}} \quad (5)$$

$$\Phi_F = \frac{kT\ln(N_A/n_i)}{q} \quad (6)$$

where $\varepsilon_{Si}$ denotes a relative permittivity of silicon, k denotes a Boltzmann constant, T denotes an absolute temperature (K), ln denotes a natural logarithm, and $n_i$ denotes an intrinsic Fermi level of silicon.

In this embodiment, interface state density $N_{SS}$ is set to $5 \times 10^{14}$ (m$^{-2}$). Work functions of platinum and silicon are respectively 5.2 and 4.95, so that $\Phi_D = 0.25$.

Capacitance $C_{OX}$ of the gate insulator 102 is a series combined capacitance of the insulator film 102a and the PCMO film 102b, and is given by equation (7):

$$C_{OX} = \frac{C_I C_P}{C_I + C_P} \quad (7)$$

Substituting equations (2), (3), (5), (6), and (7) into equation (4) and calculating based on the above parameter values yields the following. When relative permittivity $\varepsilon_P$ of the PCMO film 102b is 135, threshold voltage $V_{th}$ is 1.25 V. When relative permittivity $\varepsilon_P$ of the PCMO film 102b is 405, threshold voltage $V_{th}$ is 1.68 V. A difference between the two threshold voltages is 0.43 V.

Thus, the field effect transistor 1 can take the two threshold voltages. Since relative permittivity $\varepsilon_P$ of the PCMO film 102b is maintained stably as mentioned above, threshold voltage $V_{th}$ is maintained stably, too. This being so, a nonvolatile memory can be realized by relating the two threshold voltages to the two binary states 0 and 1.

(2) Reading Data

To read data from the field effect transistor 1, an intermediate voltage between the two threshold voltages is applied to the gate electrode 103, as one example. If threshold voltage $V_{th}$ of the field effect transistor 1 is large, no drain current flows when the intermediate voltage is applied. If threshold voltage $V_{th}$ of the field effect transistor 1 is small, on the other hand, a drain current flows when the intermediate voltage is applied. Hence data reading can be performed based on whether or not a drain current flows.

The read voltage used here is smaller than the aforementioned write voltage, and therefore there is no possibility of erroneously rewriting data at the time of data reading. In this sense, the field effect transistor 1 has an excellent operational reliability as a nonvolatile memory.

Also, while the change in relative permittivity of the PCMO film 102b upon application of the write voltage is in a relatively small range of about three times, the change in drain current is in a range of ten to more than hundred or thousand times. In this sense, the field effect transistor 1 has high data reading sensitivity.

Also, the field effect transistor 1 is expected to be reduced in size according to a scaling law (Moore's law), which contributes to a higher packing density. Hence a large-capacity nonvolatile memory can be achieved using the field effect transistor 1.

Also, the field effect transistor 1 can be manufactured by simply adding a step of forming the PCMO film 102b on the insulator film 102a, to a manufacturing process of a typical MOS (metal oxide semiconductor) field effect transistor whose gate insulator does not include the PCMO film 102b. Thus, the field effect transistor 1 can be manufactured easily, with there being no need to perform any special step.

Second Embodiment

A field effect transistor to which a second embodiment of the present invention relates is described below. The field effect transistor of the second embodiment has a similar construction to the field effect transistor of the first embodiment, but differs in the structure of the gate insulator. The following mainly focuses on this difference.

<Construction of the Field Effect Transistor>

Figure 4:
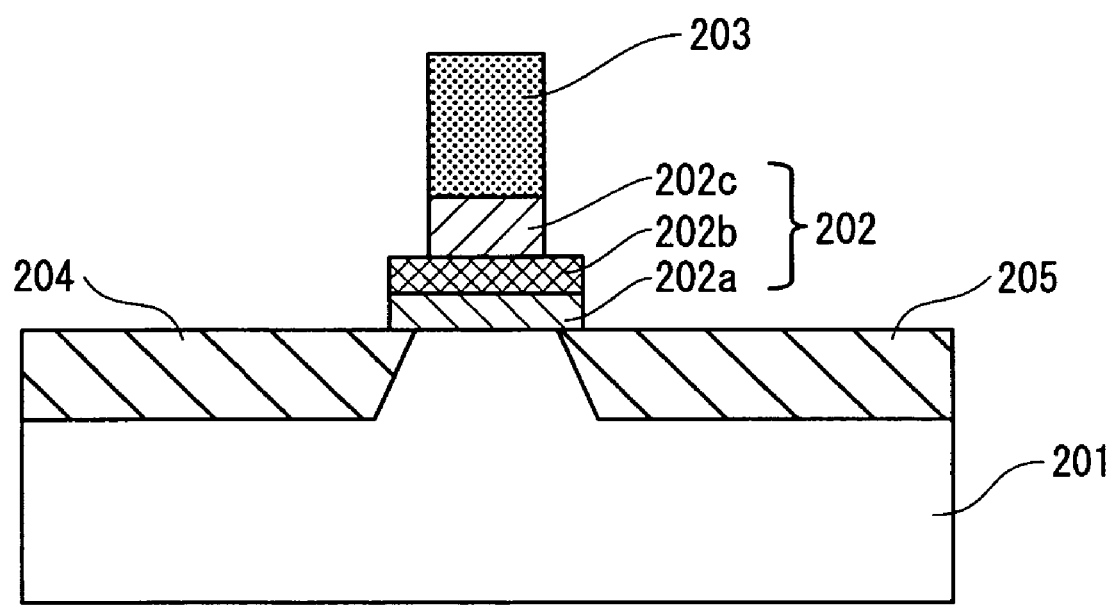
FIG. 4 is a sectional view showing a main part of a field effect transistor to which a second embodiment of the present invention relates.

FIG. 4 is a sectional view showing a main part of the field effect transistor of the second embodiment. In the drawing, a field effect transistor 2 includes a silicon substrate 201, a gate insulator 202, a gate electrode 203, a source electrode 204, and a drain electrode 205.

The gate insulator 202 is composed of an insulator film 202a, a floating gate 202b, and a PCMO film 202c which are disposed in this order on the silicon substrate 201. In more detail, the insulator film 202a is formed on part of the silicon substrate 201 between the source electrode 204 and the drain electrode 205, in the same way as the insulator film 102a in the first embodiment. The insulator film 202a is made of amorphous hafnium oxide, and has film thickness $d_I$ of 7.5 nm and relative permittivity $\in_I$ of 25, as in the first embodiment.

The floating gate 202b is a conductor film made of polysilicon, and has a film thickness of 50 nm. The PCMO film 202c has film thickness $d_P$ of 100 nm, and relative permittivity $\in_P$ which, in the case where a frequency of a voltage pulse is no more than several tens of kHz, takes one of the two values 135 and 405. An area of a main surface of the insulator film 202a is different from an area of a main surface of the PCMO film 202c.

In the first embodiment, the area of the main surface of the insulator film 102a is equal to the area of the main surface of the PCMO film 102b. In the second embodiment, on the other hand, the floating gate 202b is provided to enable effective area $S_I$ of the insulator film 202a and effective area $S_P$ of the PCMO film 202c to be designed independently of each other. By doing so, the write voltage can be reduced and the amount of change in threshold voltage can be increased. As a result, a margin of the read voltage can be increased, with it being possible to perform data reading with higher sensitivity.

Suppose effective area $S_I$ of the insulator film 202a, i.e. a contact area between the floating gate 202b and the insulator film 202a, is about twice as large as effective area $S_P$ of the PCMO film 202c, i.e. a contact area between the gate electrode 203 and the PCMO film 202c. In this case, a write voltage necessary for the field effect transistor 2 is 5 V. Thus, the write voltage can be reduced when compared with the first embodiment. As a result, the field effect transistor 2 can operate with smaller power.

Also, threshold voltage $V_{th}$ is 1.46 V when relative permittivity $\in_P$ of the PCMO film 202c is 135, and 2.33 V when relative permittivity $\in_P$ of the PCMO film 202c is 405. A difference between these two threshold voltages is 0.87 V, which is greater than the threshold voltage difference 0.43 V in the first embodiment. Accordingly, data reading can be performed more stably.

Modifications

Although the present invention has been described by way of the above embodiments, it should be obvious that the present invention is not limited to the above. Example modifications are given below.

(1) The above embodiments describe the case where a $Pr_{0.7}Ca_{0.3}MnO_3$ film is used as a variable capacitance film that varies in capacitance according to a voltage pulse, but this is not a limit for the present invention.

For example, other $Pr_XCa_{1-X}MnO_3$ films with X not being limited to 0.7 may be used. Also, other CMR materials such as $La_XCa_{1-X}MnO_3$, or other transition metal oxides such as Cr-doped $SrTiO_3$ or $NiO_x$ may be used. The effects of the present invention can still be achieved through the use of these materials.

(2) The above embodiments describe the case where hafnium oxide is used as an insulator film, but this is not a limit for the present invention. For example, zirconium oxide ($ZrO_2$) or hafnium aluminum oxide ($HfO_2/Al_2O_3$) may equally be used.

(3) The above embodiments describe the case where the relative permittivity of the PCMO film is changed by changing the voltage level of the voltage pulse applied to the PCMO film, but the present invention is not limited to this. For instance, the effects of the present invention can still be achieved by changing the pulse width or the number of applications of the voltage pulse instead of the voltage level.

(4) The above embodiments describe the case where the voltage level of the voltage pulse is determined so that the relative permittivity of the PCMO film can take two values, but the voltage level, the pulse width, or the number of applications of the voltage pulse may be determined so that the relative permittivity of the PCMO film can take three or more values. This enables the field effect transistor to store a greater amount of information.

Although the present invention has been fully described by way of examples with reference to the accompanying drawings, it is to be noted that various changes and modifications will be apparent to those skilled in the art.

Therefore, unless such changes and modifications depart from the scope of the present invention, they should be construed as being included therein.

What is claimed is:

1. A field effect transistor comprising:
   a semiconductor substrate;
   a gate electrode; and
   a gate insulator film provided between the semiconductor substrate and the gate electrode, wherein
   the gate insulator film itself has a variable capacitance exhibiting one of a plurality of values depending on a level of an applied voltage,
   the field effect transistor has a plurality of threshold voltages corresponding to the plurality of values of the variable capacitance of the gate insulator film, and
   the plurality of threshold voltages correspond to data to be stored.

2. The field effect transistor of claim 1,
   wherein the gate insulator film includes a variable capacitance film which is made of any of a colossal magnetoresistive material and a transition metal oxide.

3. The field effect transistor of claim 2,
   wherein the colossal magnetoresistive material is $Pr_XCa_{1-X}MnO_3$ where 0<X<1.

4. The field effect transistor of claim 2,
   wherein the gate insulator film further includes an insulator film which is positioned between the semiconductor substrate and the variable capacitance film.

5. The field effect transistor of claim 4,
   wherein the gate insulator further includes a conductor film which is positioned between the insulator film and the variable capacitance film.

6. The field effect transistor of claim 5,
   wherein a contact area between the gate electrode and the variable capacitance film is smaller than a contact area between the conductor film and the insulator film.

7. The field effect transistor of claim 1,
   wherein the capacitance of the gate insulator film changes according to at least one of a voltage level, a pulse width, and a number of applications of a voltage pulse applied to the gate insulator film.

8. An operation method of the field effect transistor of claim 1 in which a gate insulator film and a gate electrode are provided on a semiconductor substrate in the stated order, comprising a step of changing a capacitance of the gate insulator film itself by changing at least one of a voltage level, a pulse width, and a number of applications of a voltage pulse applied to the gate insulator film.

9. The field effect transistor of claim 8, wherein the gate insulator film has a capacitance that can change repeatedly according to an applied voltage.

10. The field effect transistor of claim 1, wherein the variable capacitance changes from one of the plurality of values to another when a level of an applied voltage exceeds a predetermined value.

11. An operation method of a field effect transistor in which a gate insulator film and a gate electrode are provided on a semiconductor substrate in the stated order, the gate insulator film having a capacitance that changes according to an applied voltage, comprising steps of:

applying an intermediate voltage between two threshold voltages corresponding to two capacitances of the gate insulator film, to the gate electrode as a read voltage; and detecting whether a drain current flows as a result of the application of the read voltage, wherein the gate insulator film itself has a capacitance that changes according to an applied voltage.

12. The operation method of claim 11, wherein the read voltage is below a voltage necessary for changing the capacitance of the gate insulator film.

* * * * *